(12) United States Patent
Karg

(10) Patent No.: US 6,576,866 B1
(45) Date of Patent: Jun. 10, 2003

(54) METHOD FOR STRUCTURING TRANSPARENT ELECTRODE LAYERS

(75) Inventor: Franz Karg, Munich (DE)

(73) Assignee: Siemens and Shell Solar GmbH (NL)

( * ) Notice: Subject to any disclaimer, the term of this patent is extended or adjusted under 35 U.S.C. 154(b) by 0 days.

(21) Appl. No.: 09/787,179

(22) PCT Filed: Sep. 17, 1999

(86) PCT No.: PCT/EP99/06905

§ 371 (c)(1),
(2), (4) Date: Jun. 28, 2001

(87) PCT Pub. No.: WO00/17942

PCT Pub. Date: Mar. 30, 2000

(30) Foreign Application Priority Data

Sep. 17, 1998 (DE) .......................... 198 42 679

(51) Int. Cl.[7] .............................. B23K 26/40
(52) U.S. Cl. ................................. 219/121.69
(58) Field of Search ............... 219/121.73, 121.74, 219/121.75, 121.68, 121.69

(56) References Cited

U.S. PATENT DOCUMENTS 4,776,335 A  * 10/1988  Nakanishi et al.
5,475,197 A  * 12/1995  Wrobel et al. ......... 219/121.75
5,520,679 A  *  5/1996  Lin
5,607,601 A     3/1997  Loper et al.
6,066,830 A  *  5/2000  Cline et al. ............ 219/121.69

FOREIGN PATENT DOCUMENTS

EP    0213910 A2    3/1987
EP    0536431 A1    4/1993
EP    0763858 A2    3/1997

OTHER PUBLICATIONS

S. Nakano, et al.: "Laser patterning method for integrated type a–Si solar cell submodules", XP–002127544, Japanese Journal of Applied Physics, vol. 25, No. 12, Dec. 1986, pp. 1936–1943.

K. L. Chopra, S. Major and D.K. Pandya, Thin Solid Films, "Transparent Conductors—A Status Review", 2194 Thin Solid Films, vol. 102 (1983) pp. 1–46.

* cited by examiner

Primary Examiner—Geoffrey S. Evans
(74) Attorney, Agent, or Firm—Wolf, Greenfield & Sacks PC

(57) ABSTRACT

The invention relates to a method for structuring transparent, conductive layers, especially for structuring transparent electrode layers in thin-layer components. The selected wavelength ($\lambda$) of the laser used for structuring should fall substantially within the plasma absorption range of the transparent electrode layer and should fulfill following three requirements: a) the wavelength $\lambda$ of the laser must be greater than the cut-off wavelength $\lambda_g^{opt}$ for optical absorption in the base absorber, b) the wavelength $\lambda$ of the laser must be greater than the cut-off wavelength for free substrate absorption (plasma absorption) $\lambda_g^{pla}$ in the transparent electrode layer, and c) the wavelength $\lambda$ of the laser must be less than the cut-off wavelength for metallic reflection $\lambda_g^{met}$ on the transparent front electrode.

9 Claims, 1 Drawing Sheet

METHOD FOR STRUCTURING TRANSPARENT ELECTRODE LAYERS

RELATED APPLICATIONS

This application claims the benefit under 35 U.S.C. §365 (c) of PCT International application PCT/EP99/06905 filed Sep. 17, 1999, designating the United States of America and published under PCT Article 21(2) in German, of which this application is a national stage filing under 35 U.S.C. §371.

Foreign priority benefits are claimed under 35 U.S.C. §119(a)–(d) or 35 U.S.C. §365(b) of German application number 19842679.8, filed Sep. 17, 1998.

DESCRIPTION

The present invention relates to a method for patterning transparent conductive layers, more particularly a method for patterning transparent electrode layers in thin-film components.

The fabrication of thin-film components such as, for example, photovoltaic modules, flat screens or switchable windows as find wide application in large-surface electronics requires, in addition to suitable methods of coating also low-cost patterning methods. The thin-film components are deposited as a rule full-surface by known deposition methods and subsequently patterned in making use of suitable patterning processes by removing defined and spatially sharply restricted areas.

Thin-film patterning is needed, for example, in integrated series circuiting of photovoltaic modules. It is known to produce such modules by depositing substantially three functional layers. A first layer is deposited, for example, by vapor deposition on a substrate and serves as the first electrode layer. Deposited on this first electrode layer is an absorber layer consisting of a correspondingly doped semiconductor. In a further step a second electrode layer is then vapor deposited on the absorber layer. This second electrode is generally transparent to radiation in the visible spectral range to ensure low attenuation of the incident sunlight where a solar module is concerned. To protect it from the environment this thin-film structure may be plastics potted and optionally sealed with a second plate.

To make for better exploitation of the complete surface area of the module in the fabrication of such thin-film components or for series-circuited solar modules to boost the total module voltage from less than 1 V per single cell to 12V or 24V of a module, the total surface area of the module is divided up into a plurality of single cells. This requires patterning the various functional layers. Series-circuiting typically comprises at least three steps in patterning the first electrode layer, the absorber layer and the second electrode layer.

It is important in this respect that the patterning technology is cost-effective, i.e. that patterning is implemented with a high throughput and low downtime. In addition, the patterning method employed needs to produce narrow patterning widths to minimize the loss in active module surface area. Apart from this, patterning must not result in any damage or contamination of adjoining or underlying semiconductor or electrode layers, i.e. the selectivity of the patterning process needs to be as high as possible.

In known patterning methods patterning the first electrode layer as firstly deposited and the subsequently deposited absorber layer is done with the aid of excimer or Nd:YAG lasers. For patterning the transparent electrode layer photolithographic patterning methods or etching, machining and mechanical patterning methods are employed. These known methods have several disadvantages, however. Photolithographic patterning is usually expensive and a plurality of steps in the process is needed to implement patterning as desired. In the known machining methods the surface areas to be machined in a later step in the process are coated by silk-screening or paste scribing which likewise involves a plurality of steps in the process (e.g. paste writing and subsequent removal). Apart from this, the patterning width can hardly be reduced to less than 100 µm. The latter applies also to mechanical patterning which although resulting in no thermal stress, also removes soft underlying layers, however, thus failing to assure the required selectivity within the layered structure. An additional problem is the loosening or detachment of the layer portions adjoining the patterning line which may result in the layer becoming totally detached and problems as regards the stability of the module when subjected to cyclic thermal stress.

Accordingly, the known methods for patterning transparent electrode layers suffer from the disadvantage that they fail to provide sufficient selectivity, do not permit achieving an adequately small patterning width and in addition, are usually associated with high costs.

It is thus the object of the present invention to provide a method for patterning transparent layers which ensures a low patterning width, is flexible as regards the patterning layout, features high reproducibility and clean processing whilst being cost-effective.

This object is achieved by a method having the features as set forth in claim 1.

Further advantageous aspects read from the sub-claims.

The gist of the invention is to beam the laser energy of a laser for patterning a transparent layer efficiently and exclusively into the transparent layer and it being neither reflected nor transmitted by the underlying layer so as to cause no thermal damage to the underlying layer. This requirement is satisfied by selecting the laser wavelength so that it falls in the range of the plasma absorption of the transparent layer.

The invention will now be detailed with reference to the attached drawings in which.

Figure 1:
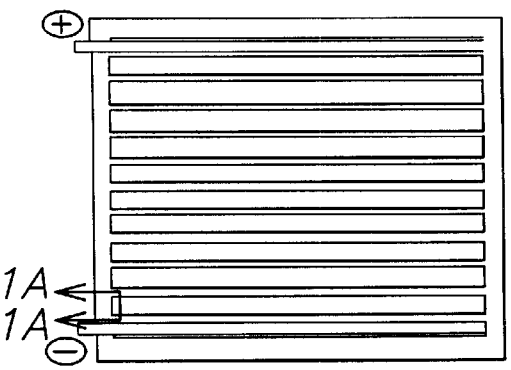
FIG. 1 is a schematic illustration of the structure of a conventional thin-film solar module, whose total surface area is divided into 10 series-circuited single cells.
Figure 1A:
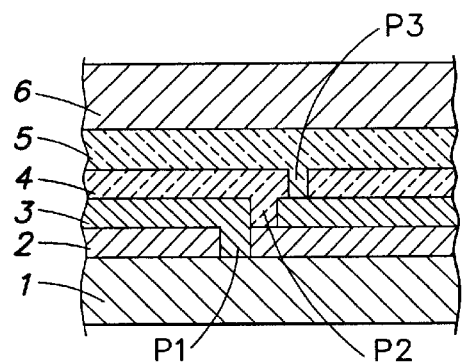
FIG. 1A is a cross-sectional view along lines 1A—1A of the thin-film solar module of FIG. 1.

Referring now to FIG. 1 there is illustrated a plan view of the total surface area the structure of a conventional thin-film solar module. In this arrangement the total surface area is divided into 10 series-circuited single cells. FIG. 1A illustrates a cross-sectional view of the layered structure of the thin-film solar module of FIG. 1. The thin-film module comprises a substrate 1 on which a first electrode layer 2 is deposited. In a first patterning step P1 the first electrode layer which also serves as the back electrode of the solar module, is correspondingly patterned. Subsequently an absorber layer 3 is deposited on the patterned back electrode and in a further patterning step P2 patterned in accordance with a desired layout. The absorber layer 3 typically comprises a semiconductor having a suitable band gap of 0.8 to 1.8 eV and features a high absorption characteristic. The same as in first patterning step P1 patterning step P2 is implemented with the aid of an excimer or Nd:YAG laser. Then, in a further step a second electrode layer 4 is deposited on the absorber layer 3. This second electrode layer 4 serves as the front electrode and is preferably transparent in the visible spectral range to pass the sunlight irradiated on the solar module with practically no attenuation, to then be absorbed by the correspondingly doped absorber layer 3. This transparent second electrode layer 4 also needs to be patterned in a further patterning step P3 to obtain a suitable circuiting of the single cells of the thin-film module. This layered structure may then be sealed from the environment e.g. by plastics potting 5 and/or a plate 6.

Such transparent front electrodes 4, as a rule, are made of doped metal oxides (transparent conductive oxides, TCOs) such as e.g. indium tin oxide (ITO), fluor or antimon doped $SnO_2$ boron, aluminum, indium or gallium doped ZnO. These materials feature an optical window in the visible and near-infrared spectral range. For energies above the band gap and in the longer wave spectral range intensified absorption occurs, however, the first being due to direct band-to-band junctions, the latter due to the so-called plasma absorption. From an optical point of view in the far infrared these doped metal oxides behave like a pure metal, i.e. they reflect the majority of the incident radiation.

An optical method of patterning such TCO layers necessitates the energy to be beamed into the metal oxide correspondingly. This is basically possible in two wavelength ranges in accordance with the optical absorption characteristic as shown in FIG. 2.

Figure 2:
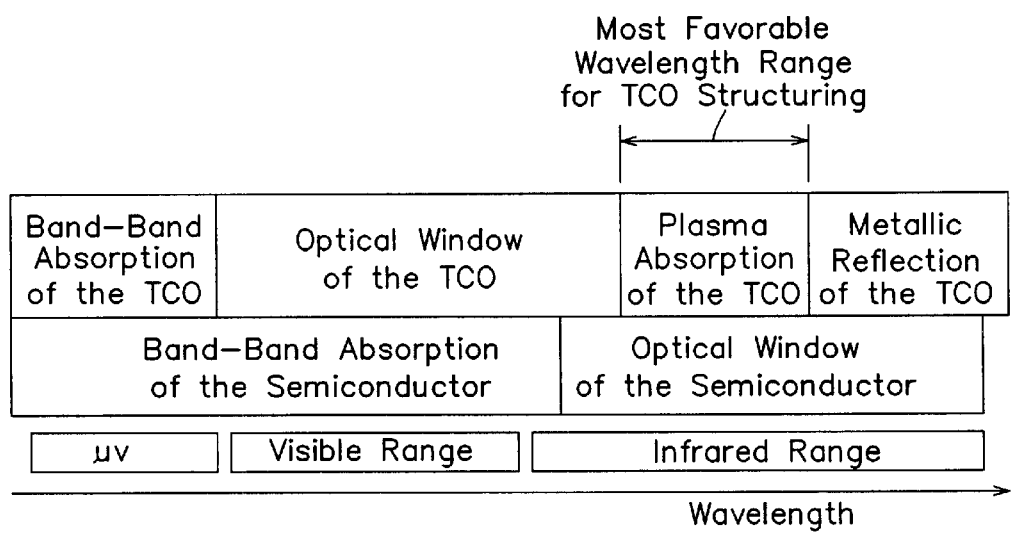
FIG. 2 is a schematic overview of how the radiation interacts with single cells in relation to a transparent electrode layer.

Referring now to FIG. 2 there is illustrated a schematic overview of how the radiation interacts with semiconductors in relation to a transparent TCO front electrode. In FIG. 2 the wavelength range is entered to the right, the UV spectral range, the visible range and the infrared range being marked accordingly. Analogous to the layered structure of a thin-film module the absorption characteristic of a typical semiconductor layer is illustrated in FIG. 2 topped by one typically transparent front electrode of TCO. Also evident from FIG. 2 is that the various absorption ranges of the transparent TCO electrode layers are shifted in the direction of the shorter wavelengths as compared to the underlying semiconductor. The reason for this shift is the higher band gap and the higher conductivity of the transparent electrode layer as compared to the semiconductor absorber layer so that the various absorption ranges of the electrode layer and absorber layer do not fall in line vertically.

In the high-energy UV range energy can be beamed into the metal oxide, for example, in making use of an excimer laser. The absorption of the laser energy is based on the band-to-band absorption of the TCO in this energy range. The disadvantage of this method, among other things, is that UV excitation often results in dissociation of the metal oxides, i.e. separation of the oxygen leaving the pure metal surfaces remaining. This is, however, undesirable for the thin-film modules as described at the outset and thus patterning in the UV range in making use of lasers poses serious problems.

Adjoining the high-energy range of band-to-band absorption is a low-frequency range which is divided into a "window range", a "plasma absorption range" and a "metallic reflection" range. Accordingly, an absorption range is to be found not only in the UV radiation range but also in the infrared radiation range due to the free substrate absorption, the so-called plasma absorption.

The optical window range directly adjoining the band-to-band absorption range of the TCO is transparent to radiation in the visible range. Adjoining this low-energy range of this optical window is the plasma absorption range. In this long-wave range the radiant energy no longer totally penetrates the transparent electrode layer, it instead losing intensity within the skin depth. As a result of this, the incident radiation is partly absorbed in the layer or reflected by the layer. With increasing wavelength the ratio of the absorbed energy to the reflected energy is again diminished, i.e. the energy percentage available for heating the electrode becomes less. In the direction of the longer wavelengths the range of plasma absorption is followed by the range of metallic reflection. In metallic reflection the radiation energy is reflected to more than 50% and is thus not suitable to beam sufficient energy into the electrode. It is additionally to be noted that although FIG. 2 shows the various absorption ranges with abrupt transitions, in reality the individual ranges merge smoothly within a certain transition zone.

The favorable wavelength range for patterning a TCO layer lies in the range of plasma absorption and thus the laser used for patterning a transparent electrode layer needs to comprise a wavelength λ satisfying the following three conditions:

a) the wavelength λ of the laser needs to be larger than the threshold wavelength $\lambda_c^{opt}$ for optical absorption in the underlying absorber;

b) the wavelength λ of the laser needs to be larger than the threshold wavelength of free substrate absorption (plasma absorption) $\lambda_c^{pla}$ in the transparent electrode layer; and c) the wavelength λ of the laser needs to be smaller than the threshold wavelength for metallic reflection $\lambda_c^{met}$ at the transparent front electrode.

The condition a) ensures that no radiation is absorbed in the absorber and thus that only a low direct heating materializes in maintaining damage to the semiconductor layer slight. The threshold wavelength $\lambda_c^{opt}$ for a $CuInSe_2$ absorber layer is, for example, 1.2 μm, for a Si absorber layer 1.13 μm, for a CdTe absorber layer 0.86 μm and for an a-Si:Hi absorber layer 0.7 μm.

It is further to be noted that the threshold wavelength $\lambda_c^{pla}$ (condition b)) is, among other things, proportional to the inverse root of the free substrate density and depends, for example, on the doping of the electrode layer. For a typically transparent electrode having a conductivity of approx. $10^{+3}$ $(\Omega cm)^{-1}$ this range begins at approx. 1200 to 1400 nm.

On the other hand, the threshold wavelength $\lambda_c^{met}$ (condition c)) drops with increasing doping and specific conductivity of the front electrode. This needs to be verified for each case by optical measurement. The higher the reflection percentage the more energy is needed for patterning, although even with a higher laser wavelength patterning is possible in principle, except that the risk of parasitic side-effects is all the more the higher the energy, and thus the reflection percentage should not exceed 50% where possible.

As an example for selecting a suitable laser wavelength a layered structure consisting of a ZnO:Al front electrode on a $CuInSe_2$ absorber is selected. The lower threshold wavelength $\lambda_c^{opt}$ for CIS is 1.2 μm. Plasma absorption in ZnO:Al for an Al concentration of approx. 1 to 2% commences at a threshold wavelength $\lambda_c^{pla}$ of approx. 1.3 μm. The threshold wavelength $\lambda_c^{met}$ at which the metallic reflection is still tolerable, i.e. less than 50% is roughly 3 μm. Thus, the wavelength range suitable in this example is between 1.3 and approx. 3 μm.

Employing a pulsed Er:YAG laser focussed to a beam diameter of less than 100 μm ZnO:Al front electrodes were machined at a wavelength of 2.94 μm with a pulsed energy density of less than 5 J/cm² with no damage to the underlying CuInSe₂ absorber layer, whereas the same test with a Nd:YAG laser (1064 nm or 532 nm) resulted in melting of the underlying CIS semiconductor and thus to short-circuits in the solar cell pattern.

It is understood that the method as described above is not limited to patterning thin-film solar modules, it instead being applicable to any thin-film components comprising transparent electrode layers.

What is claimed is:

1. A method of fabricating a thin film component, having a transparent conductive layer on top of an absorber layer, comprising:

patterning the transparent conductive layer with a laser, wherein prior to patterning the transparent conductive layer the method comprises the act of determining a wavelength (λ) of the laser, comprising the steps of:

(a) defining a lower threshold of the wavelength (λ) as the wavelength in a range of a plasma absorption of the transparent conductive layer at which no thermal damage to the underlying absorber layer occurs; and (b) defining an upper threshold of the wavelength (λ) as the wavelength at which a reflection percentage of the transparent conductive layer is less than 50%.

2. The method as set forth in claim 1, wherein for a CuInSe₂ absorber layer, the wavelength (λ) is set to a value>1.2 μm.

3. The method as set forth in claim 1, wherein for a Si absorber layer, the wavelength (λ) is set to a value>1.133 μm.

4. The method as set forth in claim 1, wherein for a Si:Hi absorber layer, the wavelength (λ) is set to a value>0.7 μm.

5. The method as set forth in claim 1, wherein the lower threshold of the wavelength for transparent layer comprising a conductivity of approx. $10^3$ $(cm)^{-1}$, is in the range from 1.2 to 1.4 μm.

6. The method as set forth in claim 1, wherein for a layered structure consisting of a ZnO:Al transparent conductive layer and a CuInSe₂ absorption layer the wavelength (λ) is set to a value in the range from 1.3 to 3 μm.

7. The method as set forth in claim 1, wherein the wavelength (λ) of the laser is set to 2.94 μm.

8. The method as set forth in claim 1, wherein a beam diameter of the laser is substantially 100 μm.

9. The method as set forth in claim 1, wherein the laser is a pulsed Er:YAG laser comprising a pulsed energy density of less than 5 J/cm².

* * * * *

UNITED STATES PATENT AND TRADEMARK OFFICE
CERTIFICATE OF CORRECTION

PATENT NO.   : 6,576,866 B1                                              Page 1 of 1
DATED        : June 10, 2003
INVENTOR(S)  : Franz Karg It is certified that error appears in the above-identified patent and that said Letters Patent is hereby corrected as shown below:

<u>Column 6,</u>
Lines 3, 5 and 8, insert a space between the word "value" and the value itself.
Line 11, replace "$(cm)^{-1}$" with -- $(\Omega cm)^{-1}$ --

Signed and Sealed this

Twenty-eighth Day of October, 2003

JAMES E. ROGAN
*Director of the United States Patent and Trademark Office*